(12) United States Patent
Sun

(10) Patent No.: US 7,661,775 B2
(45) Date of Patent: Feb. 16, 2010

(54) POSITIONING APPARATUS FOR TEST FIXTURES

(75) Inventor: Zheng-Heng Sun, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 287 days.

(21) Appl. No.: 11/309,408

(22) Filed: Aug. 4, 2006

(65) Prior Publication Data

US 2007/0090268 A1 Apr. 26, 2007

(30) Foreign Application Priority Data

Sep. 30, 2005 (CN) .................. 2005 1 0100094

(51) Int. Cl.
*E05C 9/10* (2006.01)
(52) U.S. Cl. .................... 312/216; 312/223.2
(58) Field of Classification Search ............. 312/223.1, 312/223.2, 310, 216; 361/759, 740, 732, 361/726, 747, 754, 683
See application file for complete search history.

(56) References Cited

U.S. PATENT DOCUMENTS

| | | | | |
|---|---|---|---|---|
| 2,717,816 A * | 9/1955 | Turner | ................. | 108/45 |
| 3,926,490 A * | 12/1975 | Bertellotti | ................. | 312/9.53 |
| 4,022,415 A * | 5/1977 | Roderick et al. | ................. | 248/298.1 |
| 4,462,625 A * | 7/1984 | Barnhill | ................. | 292/259 R |
| 4,964,810 A * | 10/1990 | Malotke et al. | ................. | 361/801 |
| 5,128,833 A * | 7/1992 | Lin et al. | ................. | 361/726 |
| 5,277,615 A | 1/1994 | Hastings et al. | | |
| 5,319,520 A * | 6/1994 | Sugiyama et al. | ................. | 361/693 |
| 5,394,305 A * | 2/1995 | Moral et al. | ................. | 361/796 |
| 5,447,046 A * | 9/1995 | Duffus | ................. | 70/101 |
| 5,833,337 A * | 11/1998 | Kofstad | ................. | 312/334.5 |
| 5,967,466 A * | 10/1999 | Osborne et al. | ................. | 361/726 |
| 6,331,940 B1 * | 12/2001 | Lin | ................. | 361/785 |
| 6,385,050 B1 * | 5/2002 | Orita et al. | ................. | 361/759 |
| 6,411,102 B1 | 6/2002 | Gilliland et al. | | |
| 6,424,521 B1 * | 7/2002 | Vega et al. | ................. | 361/683 |
| 6,442,037 B1 * | 8/2002 | Boe | ................. | 361/759 |
| 6,578,939 B1 * | 6/2003 | Mayer | ................. | 312/334.5 |
| 6,749,277 B2 * | 6/2004 | Michaels | ................. | 312/334.5 |
| 6,967,850 B2 * | 11/2005 | Barr et al. | ................. | 361/802 |
| 7,134,558 B1 * | 11/2006 | Mimlitch et al. | ................. | 211/26 |
| 7,156,475 B2 * | 1/2007 | Gloger, Jr. | ................. | 312/216 |
| 7,249,476 B2 * | 7/2007 | Wilson et al. | ................. | 70/94 |
| 2003/0168414 A1 * | 9/2003 | Lauchner et al. | ................. | 312/223.2 |

* cited by examiner

*Primary Examiner*—Hanh V Tran
(74) *Attorney, Agent, or Firm*—Wei Te Chung

(57) ABSTRACT

A positioning apparatus for test fixtures in a chassis of an electronic device includes a pair of fixing members, a first blocking bar, and a second blocking bar. The fixing members are attached to sidewalls of the chassis and each include a fixing hole defined therein. The first blocking bar includes a first extruding tab and a hook formed at opposite ends thereof. The first blocking bar further includes a threaded hole defined therein. The second blocking bar includes a slot defined therein to engage with the hook. The second blocking bar further includes a fastener fixed at one end thereof to engage in the threaded hole of the first blocking bar, and a second extruding bar formed at another end thereof. The first and second extruding tab engage in the fixing hole of the fixing members.

14 Claims, 3 Drawing Sheets

POSITIONING APPARATUS FOR TEST FIXTURES

FIELD OF THE INVENTION

The present invention relates to positioning apparatuses, and more particularly to a positioning apparatus which can readily position test fixtures in a chassis.

DESCRIPTION OF RELATED ART

Electronic products, such as servers and computers, should undergo a series of tests before they are shipped to market. These tests include checking hardware/firmware/software configurations, virus scans, soft scans, and so on. Conventionally, tests on interfaces of hard disk drives have been made in a chassis of a server by using hard disk driver, to see if interfaces of the server satisfy desired specifications. It is expensive to use a plurality of hard disk drives. Thus, a plurality of test fixtures with mating interfaces has been used to replace the hard disk drives in the test. However, the test fixtures often become separated from the interfaces of the server because of vibrations resulting in wasted time in reconnecting and retesting.

What is needed is a positioning apparatus which can readily position test fixtures in a chassis of an electronic device.

SUMMARY OF THE INVENTION

An exemplary positioning apparatus for positioning test fixtures in a chassis of an electronic device includes a pair of fixing members, a first blocking bar, and a second blocking bar. The fixing members are attached to sidewalls of the chassis and each includes a fixing hole defined therein. The first blocking bar includes a first extruding tab and a hook formed at opposite ends thereof. The first blocking bar further includes a threaded hole defined therein. The second blocking bar includes a slot defined therein to engage with the hook. The second blocking bar further includes a fastener fixed at one end thereof to engage in the threaded hole of the first blocking bar, and a second extruding bar formed at another end thereof. The first and second extruding tabs engage in the fixing hole of the fixing members.

Other advantages and novel features will become more apparent from the following detailed description when taken in conjunction with the accompanying drawings, in which:

DETAILED DESCRIPTION OF THE INVENTION

Figure 1:
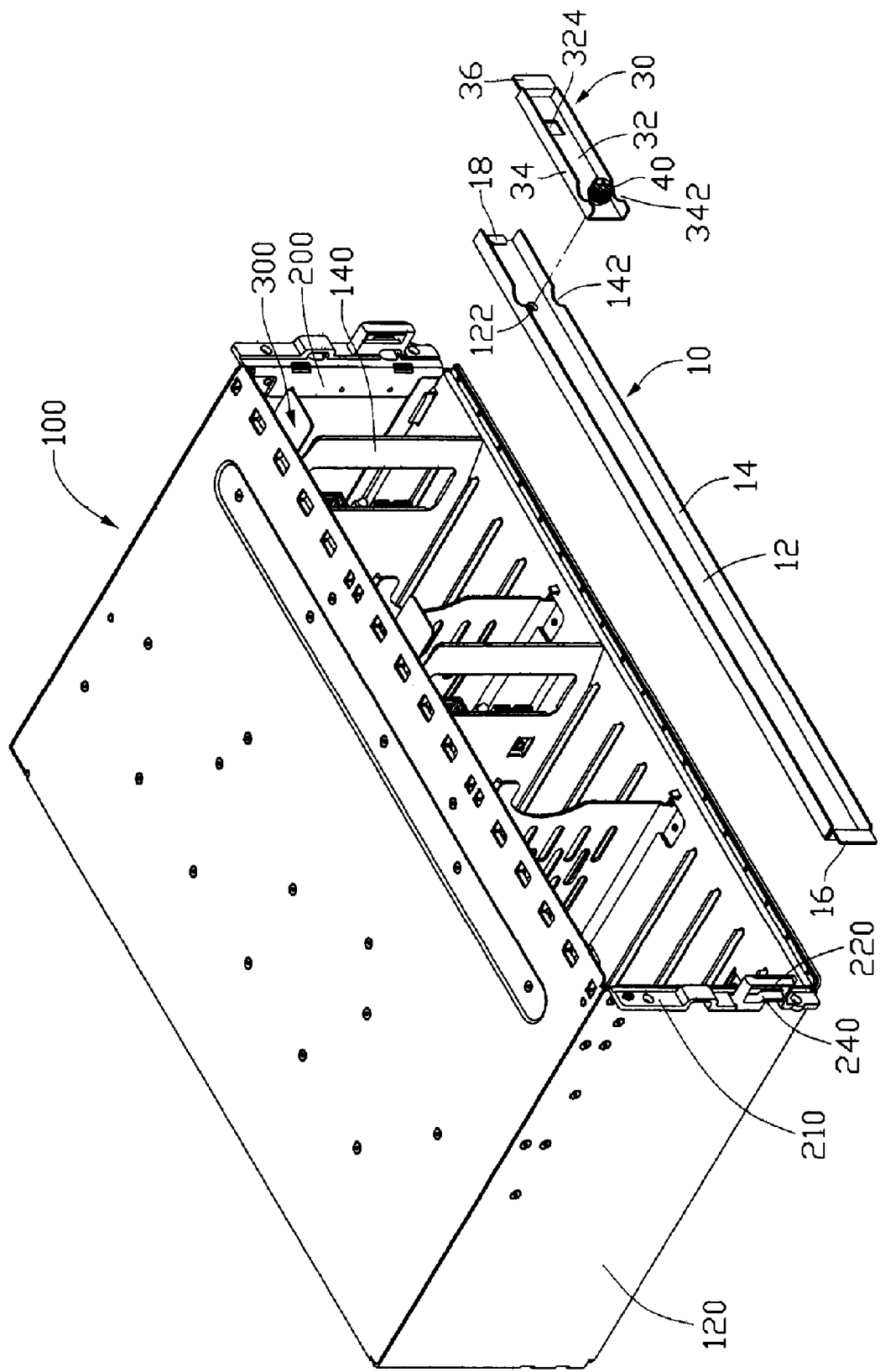
FIG. 1 is an exploded, isometric view of a positioning apparatus in accordance with a first preferred embodiment of the present invention, together with a chassis.
Figure 2:
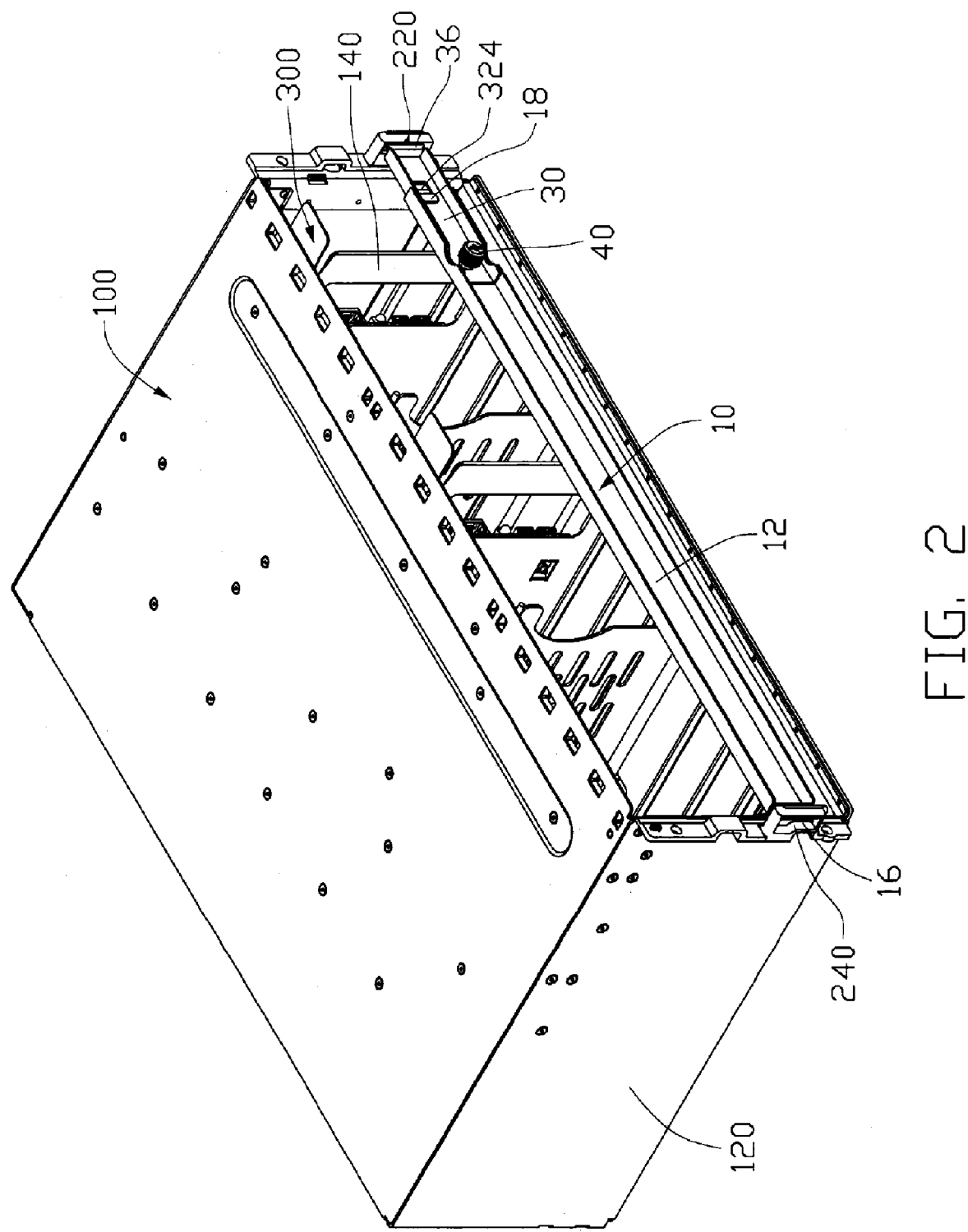
FIG. 2 is assembled view of FIG. 1.

Referring to FIG. 1, a positioning apparatus according to a first preferred embodiment of the present invention is for positioning a plurality of test fixtures 300 in a chassis 100 of an electronic device to test interfaces of the chassis 100, such as hard disk drive interfaces. The positioning apparatus includes a pair of fixing members 200, a first blocking bar 10, a second blocking bar 30, and a fastener 40.

The chassis 100 includes a pair of sidewalls 120, and a plurality of spacing walls 140 formed therebetween, cooperatively defining a plurality of receiving spaces to receive the test fixtures 300 therein.

The fixing members 200 are separately attached to inner sides of the sidewalls 120 of the chassis 100 and each includes a fixing plate 210 perpendicular to the sidewalls 120. A block 220 defining a hole 240 extends perpendicularly from each fixing plate 210.

The first blocking bar 10 includes an elongate main body 12, each lengthwise edge of the main body 12 has a flange 14 extending perpendicularly therefrom in a same direction. The flanges 14 define a slideway therebetween. The main body 12 includes a first extruding tab 16 at one end, and a hook 18 formed at an opposite end thereof. A threaded hole 122 is defined in the main body 12 near the hook 18. A pair of arced first notches 142 is defined in the flanges 14, corresponding to the threaded hole 142.

The second blocking bar 30 is attached to the first blocking bar 10. The second blocking bar 30 includes a base 32, and a pair of wings 34 respectively extending perpendicularly from two opposite lengthwise edges of the base 32. The wings 34 slide along the flanges 14 of the first blocking bar 10. The base 32 includes a second extruding tab 36 formed at one end thereof. The fastener 40 may be any appropriate fastener such as a captive screw 40 used in this embodiment. The base 32 defines a hole (not shown) in another end thereof to fix the fastener 40 thereon, corresponding to the threaded hole 122 of the first blocking bar 10. The base 32 includes a slot 324 defined therein between the fastener 40 and the second extruding tab 32, corresponding to the hook 18 of the first blocking bar 10. A pair of arced second notches 342 is defined in the wings 34, corresponding to the first notches 142 of the first blocking bar 10.

In assembly, the fixing members 200 are attached to the sidewalls 120 of the chassis 100. The first blocking bar 10 is attached to the chassis 100 with the first extruding tab 16 extending through a left fixing hole 240. The second blocking bar 30 is slidably attached to the first blocking bar 10, with the wings 34 aligned with the flanges 14. The second blocking bar 30 is moved rightward so that the hook 18 engages with the slot 324 and the second extruding tab 36 extends into a right fixing hole 240. The fastener 40 aligns with and engages in the threaded hole 142. The main body 12 of the first blocking bar 10 and the base 32 of the second blocking bar 30 abut outer ends of the test fixtures 300 to prevent the interfaces of the test fixtures 300 disengaging from the interfaces of the chassis 100. The first notches 142 of the first blocking bar 10 align with the second notches 342 of the second blocking bar 30, providing an operating space for users to conveniently disengage the fastener 40.

Figure 3:
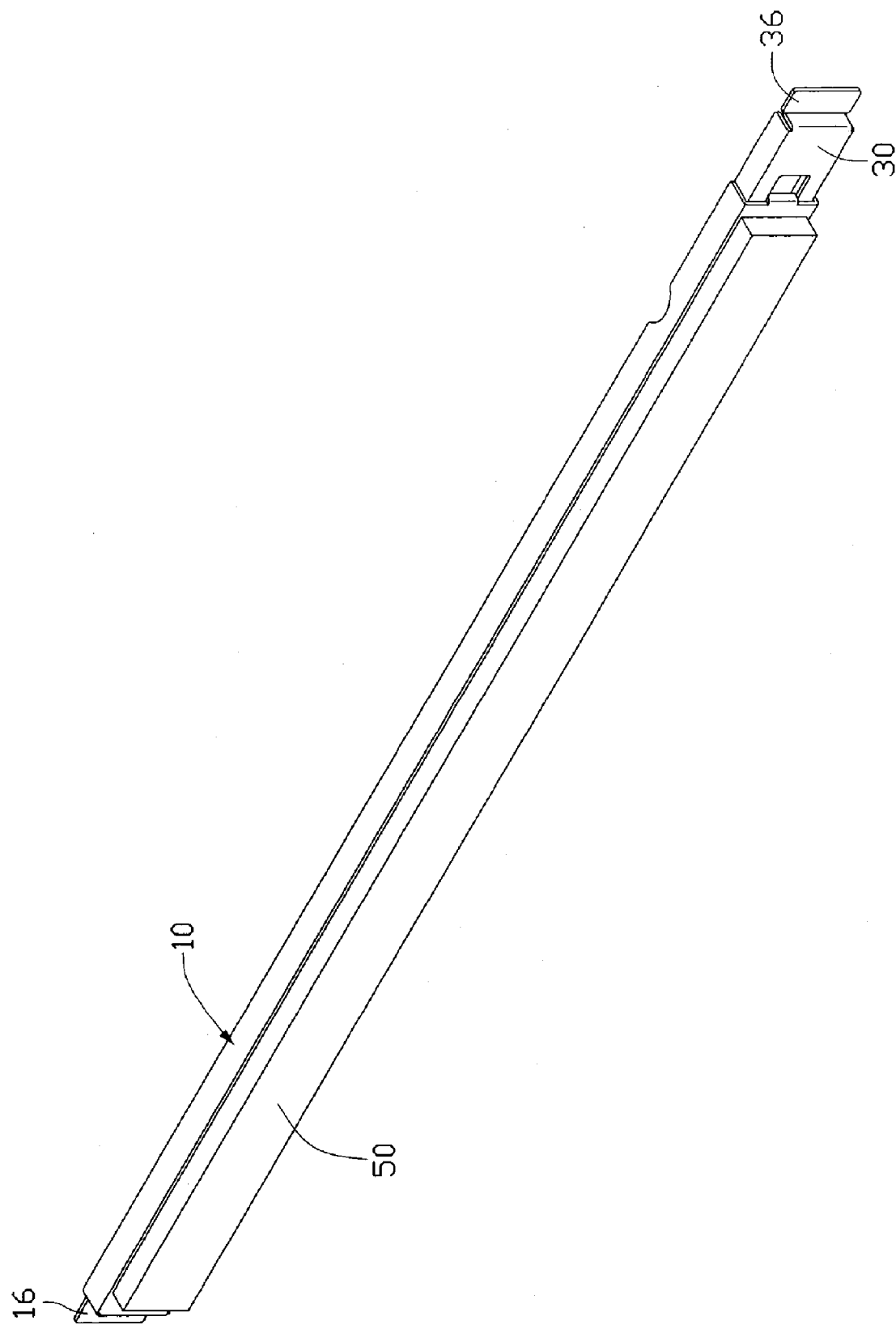
FIG. 3 is an assembled, isometric view of a positioning apparatus in accordance with a second preferred embodiment of the present invention.

Referring to FIG. 3, a positioning member according to a second preferred embodiment of the present invention has a similar configuration as the first preferred embodiment and includes a contacting member 50 attached to an outer surface of the main body 12 of the first blocking bar 10 by adhesives or glues, for effectively abutting small size test fixtures. The contacting member 50 is may be a kind of plastic pad, or polystyrene foam.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments.

What is claimed is:

1. A positioning apparatus mounted to a chassis of an electronic device for fixing test fixtures in the chassis, the chassis comprising a pair of sidewalls, the positioning apparatus comprising:
   a pair of fixing members arranged on the sidewalls of the chassis and defining a pair of fixing holes;
   a first blocking bar adapted to abut the test fixtures and comprising a first extruding tab at one end thereof to engage in one of the fixing holes, a hook formed at the other end thereof, a pair of flanges extending outwardly from opposite side edges, and a threaded hole defined therein; and
   a second blocking bar slidably attached to the first blocking bar and comprising a second extruding tab engaging in the other one of the fixing holes, a captive screw mounted on the second blocking bar, a pair of wings extending outwardly from opposite side edges, and a slot defined in the second blocking bar for accommodating sliding of the hook of the first blocking bar therein, thereby allowing adjusting of the distance between the first extruding tab and the second extruding tab when the captive screw disengages from the threaded hole;
   wherein the captive screw extends in a direction substantially perpendicular to a sliding direction of the second blocking bar to engage in the threaded hole, thereby securing the second blocking bar to the first blocking bar; wherein a pair of aligned arced notches is separately defined in the flanges of the first blocking bar and the wings of the second blocking bar to provide an operating space for manipulating the captive screw.

2. The positioning apparatus as claimed in claim 1, wherein the first blocking bar comprises a main body, the second blocking bar comprises a base, the captive screw is secured to the base of the second blocking bar, the threaded hole is defined in the main body of the first blocking bar.

3. The positioning apparatus as claimed in claim 2, wherein said pair of flanges extending from the main body thereof, the main body and the pair of flanges of the first blocking bar corporately form a channel to slidably receive the second blocking bar.

4. The positioning apparatus as claimed in claim 3, wherein said pair of wings extending from the base thereof.

5. The positioning apparatus as claimed in claim 2, further comprising a contact member, wherein the contact member is attached to an outer surface of the main body of the first blocking bar.

6. The positioning apparatus as claimed in claim 5, wherein the contact member is a piece of plastic pad, or a piece of polystyrene foam.

7. A positioning apparatus assembly comprising:
   a chassis comprising a pair of sidewalls and accommodating a plurality of test fixtures between the sidewalls; and
   a blocking member connected between the sidewalls, and abutting the test fixtures to prevent the text fixtures from exiting through the chassis; wherein the blocking member comprises:
      a first blocking bar comprising a pair of flanges extending outward from opposite side edges and defining a threaded hole arranged between the flanges, the first blocking bar connected to one of the sidewalls;
      a second blocking bar comprising a pair of wings extending outward from opposite side edges and defining a hole arranged between the wings, the second blocking bar being slidable between the flanges of the first blocking bar, and capable of extending out of the first blocking bar to be connected to the other sidewall; and
      a captive screw passing through the hole of the second blocking bar and engaging in the threaded hole of the first blocking bar to prevent the second blocking bar from sliding relative to the first blocking bar when the second blocking bar slides relative to the first blocking bar to a fixed position in which the hole of the second blocking bar aligns with the threaded hole of the first blocking bar;
      wherein each flange defines a first notch aligning with the threaded hole, each wing defines a second notch aligning with the captive screw and capable of aligning with the first notches to provide an operating space for manipulating the captive screw.

8. The positioning apparatus assembly as claimed in claim 7, further comprising a pair of fixing members arranged on two opposite sidewalls of the chassis, each of the fixing members defining a fixing hole, wherein the first blocking bar comprises a main body, a first extruding tab extends from a first end of the main body, the second blocking bar comprises a base, a second extruding tab extends from a first end of the base which is far away from the first extruding tab; the first and second extruding tabs engage in the fixing holes of the corresponding fixing members.

9. The positioning apparatus assembly as claimed in claim 8, wherein the threaded hole is defined in a second end of the main body of the first blocking bar, the captive screw is mounted to a second end of the base of the second blocking bar opposite to the second extruding tab.

10. The positioning apparatus assembly as claimed in claim 9, wherein the base of second blocking bar comprises a slot defined therein, the main body of first blocking bar comprises a hook extending from the second end thereof to engage in the slot.

11. The positioning apparatus assembly as claimed in claim 9, further comprising a contact member, wherein the contact member is attached to an outer surface of the main body of the first blocking bar.

12. The positioning apparatus assembly as claimed in claim 11, wherein the contact member is a piece of plastic pad, or a piece of polystyrene foam.

13. The positioning apparatus assembly as claimed in claim 8, wherein the fixing members each comprise a fixing plate perpendicular to the sidewalls of the chassis, a block extends from each of the fixing plates, the fixing holes are defined in the blocks.

14. The positioning apparatus assembly as claimed in claim 7, wherein the captive screw extends in a direction perpendicular to the longitudinal direction of the first blocking bar.

* * * * *

UNITED STATES PATENT AND TRADEMARK OFFICE
CERTIFICATE OF CORRECTION

PATENT NO. : 7,661,775 B2
APPLICATION NO. : 11/309408
DATED : February 16, 2010
INVENTOR(S) : Zheng-Heng Sun It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 483 days.

Signed and Sealed this

Thirtieth Day of November, 2010

David J. Kappos
*Director of the United States Patent and Trademark Office*